United States Patent
Chi

(10) Patent No.: US 6,657,240 B1
(45) Date of Patent: Dec. 2, 2003

(54) GATE-CONTROLLED, NEGATIVE RESISTANCE DIODE DEVICE USING BAND-TO-BAND TUNNELING

(75) Inventor: Min-Hwa Chi, Hsin-chu (TW)

(73) Assignee: Taiwan Semiconductoring Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/056,622

(22) Filed: Jan. 28, 2002

(51) Int. Cl.⁷ .............................................. H01L 29/74
(52) U.S. Cl. ........................................ 257/162; 257/163
(58) Field of Search ................................ 257/162, 164, 257/151, 175, 176

(56) References Cited

U.S. PATENT DOCUMENTS 5,710,444 A  *  1/1998  Neubrand et al. .......... 257/140
5,796,126 A  *  8/1998  Han et al. ................... 257/141

OTHER PUBLICATIONS

Hodges et al. Analysis and Desigg of Digital Integrated Circuits, McGraw–Hill, pp 26, 27.*

* cited by examiner

*Primary Examiner*—Douglas A. Wille
(74) *Attorney, Agent, or Firm*—George O. Saile; Stephen B. Ackerman; Rosemary L. S. Pike

(57) ABSTRACT

A new gate-controlled, negative resistance diode device is achieved. The device comprises, first, a semiconductor layer in a substrate. The semiconductor layer contains an emitter region and a barrier region. The barrier region is in contact with the emitter region and is laterally adjacent to the emitter region. The semiconductor layer contains a collector region. A drift region comprises the semiconductor layer between the barrier region and the collector region. Finally, a gate comprises a conductor layer overlying the drift region, the barrier region, and at least a part of the emitter region with an insulating layer therebetween. A method of manufacture is achieved.

23 Claims, 13 Drawing Sheets

GATE-CONTROLLED, NEGATIVE RESISTANCE DIODE DEVICE USING BAND-TO-BAND TUNNELING

BACKGROUND OF THE INVENTION (1) Field of the Invention

The invention relates to a negative resistance diode device for high frequency RF applications, and more particularly, to a gate-controlled, negative resistance diode device that utilizes band-to-band tunneling.

(2) Description of the Prior Art

As CMOS technology continues to reduce in device scale, the operating frequency of these circuits increases. For example, the digital signals in state-of-the art microprocessors are operating in excess of about 500 MHz clock frequency and will approach about 1 GHz very soon. Further, the small signal operating frequency of CMOS transistors, fabricated at feature sizes of about 0.25 microns, is in the range of about 1 GHz for radio frequency (RF) wireless applications.

Typical on-chip clock generator circuits are presently based on ring oscillator designs wherein a series of inverters are connected in a ring. The operating frequency of such ring oscillators is determined by the total propagation delay from the first inverter to the last inverter. Often, these ring oscillator circuits consume a large chip area because many inverters must be placed in series. In addition, a large switching noise is generated by these ring oscillator designs.

As an alternative to CMOS inverters, devices that are called "negative resistance" diodes are known in the art. For example, impact ionization avalanche transit time (IMPATT) diodes and barrier injection transit time (BARITT) diodes may be used to create negative resistance diode functions. IMPATT and BARITT diodes have been found to be useful in the formation of oscillators and amplifiers for high frequency RF and microwave applications. However, as will be shown in the following observations, these prior art devices have several disadvantages.

Referring now to FIG. 1, a simplified diagram of an IMPATT diode device is shown. Further, a graph of the electric field distribution across this IMPATT device during normal operation is illustrated. The IMPATT device comprises semiconductor bulk regions 14, 18, 22, and 26. This semiconductor bulk region further comprises a source region 14, a barrier region 18, a drift region 22, and a collector region 26. A typical dopant profile is shown in the illustration. The source region 14 is heavily doped n-type (n+). The barrier junction 18 is doped p-type (p). The drift region 22 is very lightly doped, or nearly intrinsic, and may be either n-type (ι) or p-type (v). The collector region 26 is heavily doped p-type (p+).

The operating principle of the IMPATT diode is based on two effects: the generation of charge carriers via impact ionization and the finite transit time of such charge carriers in a depleted drift region. The IMPATT diode requires a dc bias voltage $V_{DC}$ 30. The dc bias voltage $V_{DC}$ 30 creates a reverse bias across the source-to-barrier (n+/p) junction 14 and 18. This dc bias voltage $V_{DC}$ 30 is preferably high enough to deplete the drift region 22 and to be near the onset of reverse avalanche current. An ac voltage signal $V_{AC}$ 34 is placed across the IMPATT diode device in series with the dc bias voltage $V_{DC}$ 30. As can be seen from the graph, the static electric field caused by the dc bias voltage $V_{DC}$ 30 is spread across the barrier junction 18 and the drift region 22.

Referring now to FIG. 2, the high frequency operation of the IMPATT device is shown. The ac voltage signal $V_{AC}$ 34 is plotted 60 as a frequency multiple of time (ωt). During a positive cycle, between 0 and π, the magnitude of the ac voltage signal $V_{AC}$ 34 is large enough to trigger significant impact ionization occurs at the source-to-barrier interface 14 and 18. Electron-hole pairs are thereby generated and, later, multiplied by the avalanche mechanism. Holes are collected toward the barrier region (p) side 18 while the electrons are collected in the source region (n+) side 14.

Due to the nature of avalanche multiplication, the maximum magnitude of the hole current, $I_o(t)$ 64, occurs at the end of the positive cycle of the ac voltage signal $V_{AC}$ 34, or at the time π. Therefore, the maximum hole current $I_o(t)$ 64 generated in the source-to-barrier interface 14 and 18 exhibits a π/2 delay from the maximum ac voltage, which is typically known as the "π/2 avalanche delay."

Once the holes enter the drift region 22, the carrier transport mechanism comprises carrier drift because the drift region 22 is nearly intrinsic and is depleted. The external current flow $I_e(t)$ 68 begins just as the ac voltage signal $V_{AC}$ enters the negative cycle between π and 2π. If the drift region 22 is long enough such that the transit time or drift time is exactly π (wherein π=ωL/$v_s$), then the external current $I_e(t)$ is 180 degrees out of phase with the ac voltage signal. In other words, a small-signal "negative resistance" has been achieved. This negative resistance actually delivers power to the external circuit from the diode device. Such a device may be used for the creation of an oscillator circuit, for example.

Referring now to FIG. 3, a BARITT diode device is illustrated in simplified form. An electric field distribution plot is given. A semiconductor bulk layer comprises a source region 108, a graded barrier region 112 and 116, a drift region 120, and a collector 124. The source junction 108 is heavily doped p-type (p+). The graded barrier region 112 and 116 comprises a moderately doped n-type region ($n_1$) 112 and a heavily doped n-type region (n+) 116. The drift region 120 comprises a lightly doped, or nearly intrinsic, region of semiconductor that is lightly doped n-type ($n_2$). The collector region 124 is heavily doped p-type (p+).

The operating principle of the BARITT diode is based on two effects: the generation of charge carriers via barrier injection of a forward biased p-n diode and the finite transit time of such charge carriers in a depleted drift region. The BARITT diode requires a dc bias voltage $V_{DC}$ 128. The dc bias voltage $V_{DC}$ 128 creates a forward bias of, for example, about 0.7 V across the source-to-barrier (p+/$n_1$) junction 108 and 116. This dc bias voltage $V_{DC}$ 30 is preferably high enough to deplete the drift region 120. An ac voltage signal $V_{AC}$ 132 is placed across the BARITT diode device in series with the dc bias voltage $V_{DC}$ 128. The static electric field caused by the dc bias voltage $V_{DC}$ 128 causes the drift region ($n_2$) 120 to be fully depleted. The electric field is distributed 130 across the BARITT device as shown.

Referring now to FIG. 4, the high frequency operation of the IMPATT device is shown. The ac voltage signal $V_{AC}$ 132 is plotted 150 as a frequency multiple of time (ωt). During a positive cycle, between 0 and π, the p+/$n_1$ is forward biased. Significant hole current, $I_o(t)$ 160, is injected into the $n_1$ region 112. Note that the much lower doping of the $n_1$ region 112 compared to the p+ junction 116 means that the corresponding electron injection current from the $n_1$ region 112 to the p+ region 108 is negligible when compared to the magnitude of the hole current $I_o(t)$ 160. Holes are collected toward the heavily doped portion of the barrier junction (n+) 116.

Due to the nature of a forward biased p-n junction, the maximum magnitude of the hole current, $I_o(t)$ 160, occurs at the midpoint of the positive cycle of the ac voltage signal $V_{AC}$ 132, or at the time $\pi/2$. Therefore, the maximum hole current $I_o(t)$ 160 generated exhibits no $\pi/2$ delay from the maximum ac voltage and is therefore "in phase" with the ac voltage.

Once the holes enter the drift region ($n_2$) 120, the carrier transport mechanism comprises carrier drift because the drift region 120 is nearly intrinsic and is depleted. The external current flow $I_e(t)$ 164 begins just as the ac voltage signal $V_{AC}$ 132 hits midpoint of the positive cycle between 0 and $\pi$. The external current flow $I_e(t)$ 164 continues during the negative half-cycle of the ac voltage signal $V_{AC}$ 132 due to the drift region 120 finite transit time. If the drift region 120 is long enough such that the transit time or drift time is exactly $3\pi/2$ (wherein $\pi = \omega L/v_s$), then the external current $I_e(t)$ is 180 degrees out of phase with the input ac voltage 132 during the negative half-cycle from $\pi$ to $2\pi$. Once again, a small-signal "negative resistance" or power gain has been achieved. However, in this case, a significant amount of power loss is incurred due to the "positive resistance" quarter cycle from $\pi/2$ to $\pi$ of the ac voltage cycle.

It is found, therefore, that the BARITT diode exhibits a lower power conversion efficiency than the IMPATT diode due to the above-mentioned power loss. However, the IMPATT diode suffers from two disadvantages. First, a large dc voltage of, for example, greater than about 30 Volts must be provided not only to deplete the drift region but also to induce the avalanche injection. It is difficult to provide this large voltage in a sub-micron integrated circuit device. Second, the impact ionization and avalanche multiplication process generate a large amount of noise. By comparison, the BARITT device generates less noise and can be operated at a lower dc bias of, for example, about 15 Volts. Unfortunately, the BARITT diode suffers from higher loss and still requires a somewhat large voltage to fully deplete the drift region of carriers. Finally, both the IMPATT and the BARITT devices of the prior art are difficult to integrate in a monolithic VLSI process. Therefore, these devices are typically only available in discrete form.

Several prior art inventions describe high frequency or transit time devices. U.S. Pat. No. 5,675,295 to Brebels et al teaches a microwave oscillator device and a method of manufacture thereof. The oscillator may use any of several resonant tunnel diode (RTD) devices as the active component. The RTD may comprise a BARITT diode. U.S. Pat. No. 4,745,374 to Nishzawa et al discloses a transit time, negative resistance device that performs carrier injection by both avalanche and tunneling. The diode is formed by a GaAs stack comprising p+/n+/n−/n+. U.S. Pat. No. 4,358,759 to Stewart et al teaches the application of a BARITT diode in a microwave movement detector circuit. U.S. Pat. No. 5,617,104 to Das discloses a tunable ferroelectric transmitting system where a negative resistance diode, such as an IMPATT, is used. In the article, "Monolithic IMPATT Technology," by Bayraktaro, in Microwave Journal, April 1989, pp. 73–86, a monolithic IMPATT diode is described. In the article, "Comparison of GIDL in p+-poly PMOS and n+-poly PMOS Devices," by Lindert et al, IEEE Electron Device Letters, Vol. 17, No. 6, June 1996, pp.285–287, discusses a related matter concerning gate-induced drain leakage (GIDL) in LDD MOSFETs.

SUMMARY OF THE INVENTION

A principal object of the present invention is to provide a negative resistance diode device in the manufacturing of an integrated circuit device.

A further object of the present invention is to provide a negative resistance diode device wherein a gate controls the device operation.

A yet further object of the present invention is to create a gate-controlled, negative resistance diode device that is integrated into a MOS process.

Another yet further object of the present invention is to create a gate-controlled, negative resistance diode device, which exhibits excelled negative resistance (gain) and low loss at high signal frequencies.

Another yet further object of the present invention is to create a gate-controlled, negative resistance diode device that may be used with a relatively small DC bias.

Another further object of the present invention is to provide an effective method of manufacturing a negative resistance diode device.

In accordance with the objects of this invention, a new gate-controlled, negative resistance diode device is achieved. The device comprises, first, a semiconductor layer in a substrate. The semiconductor layer contains an emitter region and a barrier region. The barrier region is in contact with the emitter region and is laterally adjacent to the emitter region. The semiconductor layer contains a collector region. A drift region comprises the semiconductor layer between the barrier region and the collector region. Finally, a a gate comprises a conductor layer overlying the drift region, the barrier region, and at least a part of the emitter region with an insulating layer therebetween.

Also in accordance with the objects of this invention, a new method to form a gate-controlled, negative resistance diode device in the manufacture of an integrated circuit device is achieved. A semiconductor layer is provided in a substrate. Ions are selectively implanted into the semiconductor layer to form an emitter region. Ions are implanted into the semiconductor layer to form a barrier region. An insulator layer is formed overlying the semiconductor layer. A conductor layer is deposited overlying the insulator layer. The conductor layer may be metal or polysilicon and may be ion implanted. The conductor layer is patterned to form a gate. The gate overlies the barrier junction and at least a part of the emitter region. Ions are implanted into the semiconductor layer to form a collector region and to complete the diode device in the manufacture of said integrated circuit device. A drift region is formed in the semiconductor layer where the gate overlies the semiconductor layer between the collector region and the barrier region. The drift region is controlled by applying a bias on the gate region.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses a gate-controlled, band-to-band tunneling (BBT) transit time diode of the present invention and a method of manufacture thereof. It should be clear to those experienced in the art that the present invention can be applied and extended without deviating from the scope of the present invention.

Figure 1:
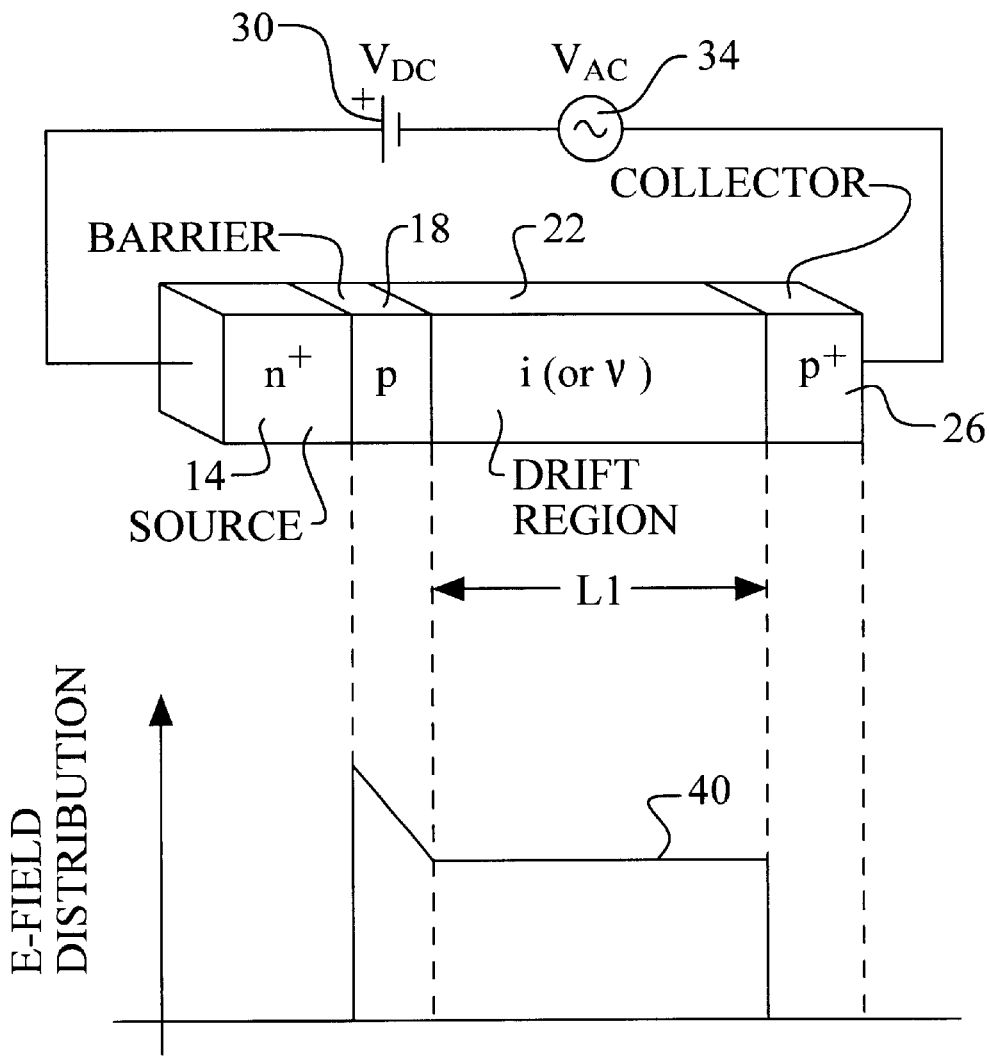
FIG. 1 illustrates a simplified diagram of an ion impact avalanche transit time (IMPATT) diode device and a graph of the electric field distribution across this IMPATT device during normal operation.
Figure 2:
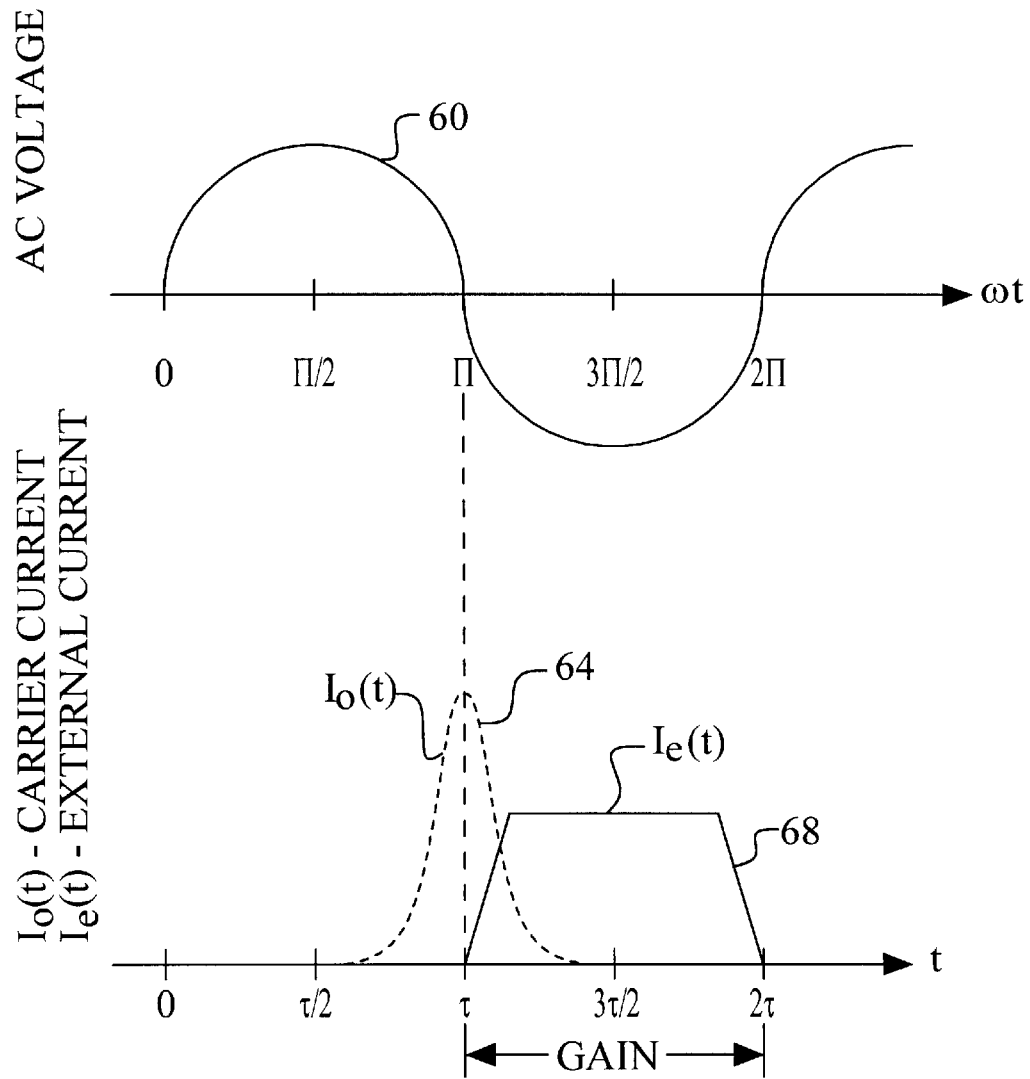
FIG. 2 illustrates the high frequency response of an IMPATT device.
Figure 3:
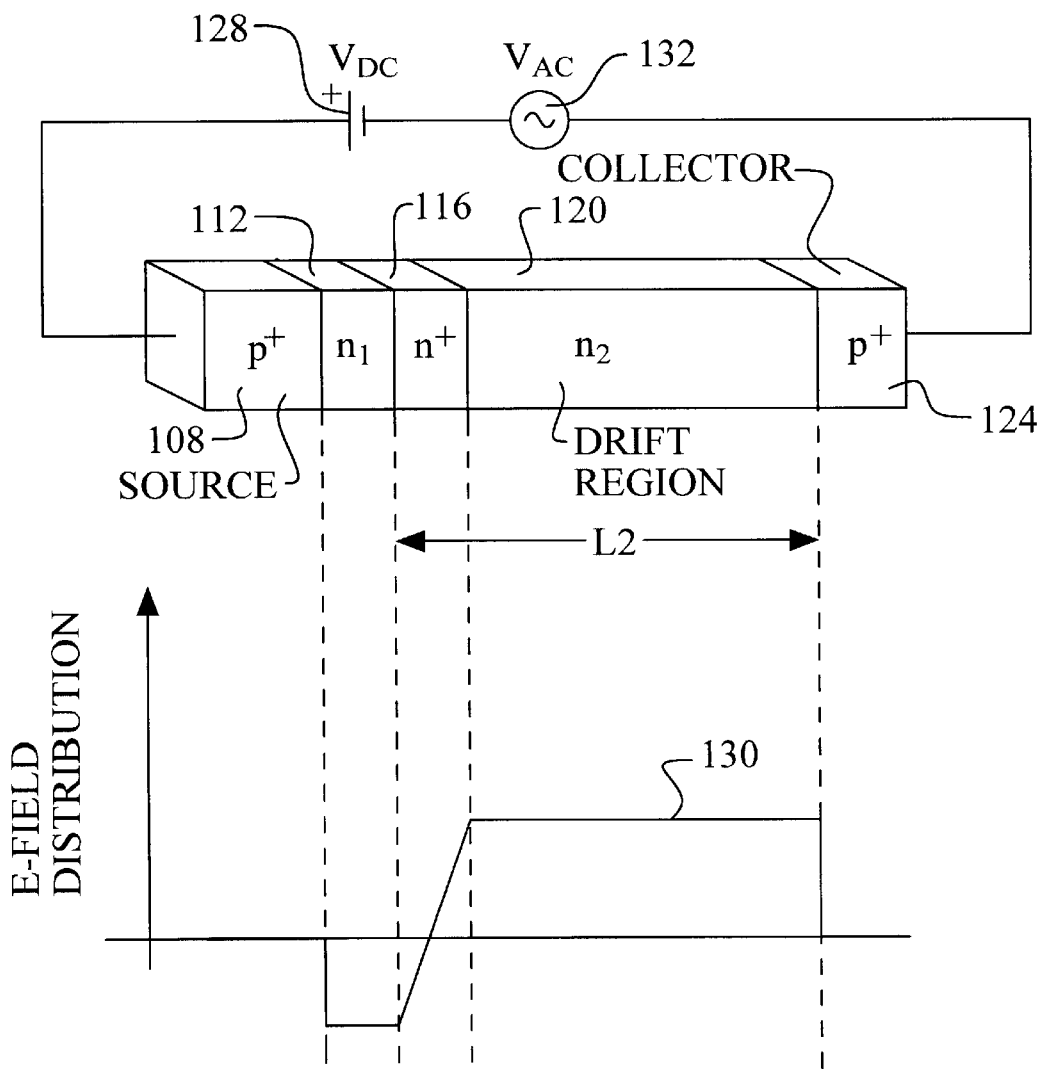
FIG. 3 illustrates a simplified diagram of a barrier injection transit time (BARITT) diode device and a graph of the electric field distribution across this BARITT device during normal operation.
Figure 4:
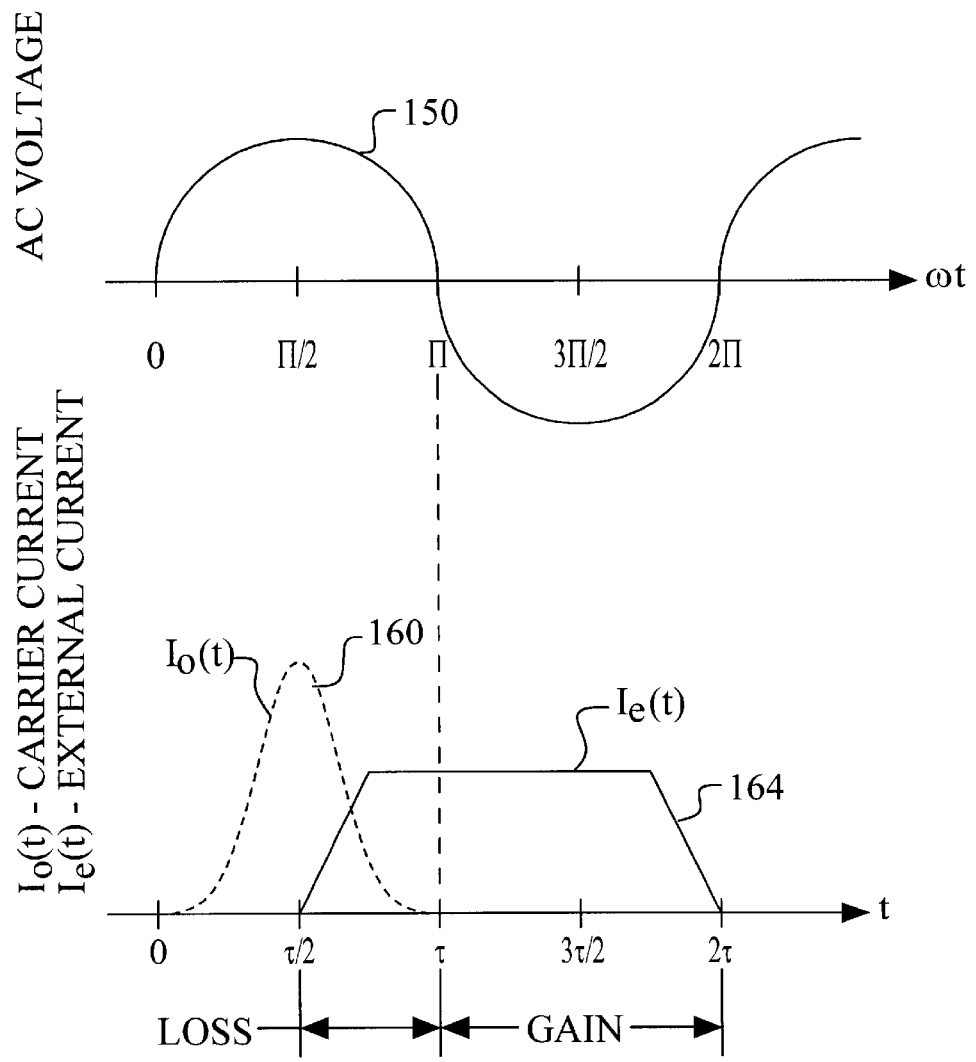
FIG. 4 illustrates the high frequency response of a BARITT device.
Figure 5:
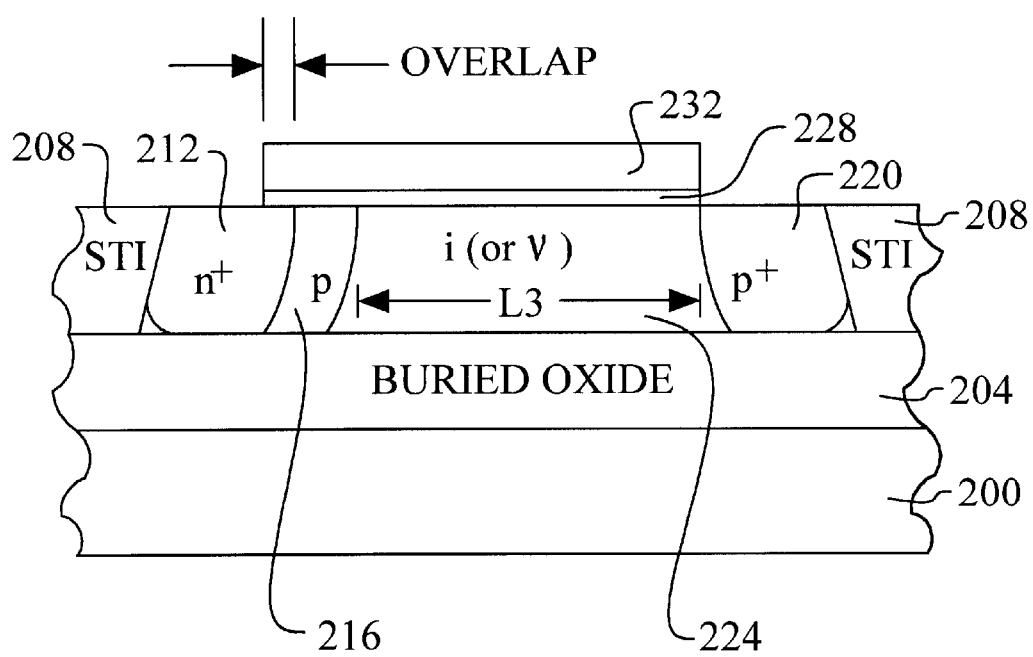
FIG. 5 illustrates a cross section of the preferred embodiment (n+/p/i/p+ case) of the band-to-band tunneling transit time (BBT) diode device of the present invention.

Referring now particularly to FIG. 5, a cross section of the preferred embodiment of the gate-controlled, band-to-band tunneling (BBT) transit time diode device of the present invention. This simplified drawing illustrates several important features of the novel device of the present invention. The novel BBT transit time diode device uniquely combines the concept of a transit time drift region 224 with a metal-oxide-silicon (MOS) style gate 232.

In particular, the preferred embodiment device is formed on a silicon-on-insulator (SOI) wafer. A buried insulator layer 204 overlies a substrate 200. The buried insulator layer 204 preferably comprises oxide, and more preferably, silicon oxide. The substrate preferably comprises a semiconductor, and, more preferably, silicon. A semiconductor layer 212, 216, 224, and 220, overlies the buried insulator layer 204 and forms the bulk material in which the BBT diode is formed. The semiconductor layer 212, 216, 224, and 220, preferably comprises an epitaxially-grown layer, and, more preferably, comprises an epitaxially-grown silicon layer. It is important to note that the BBT device may be formed using a non-silicon layer such as GaAs on a non-silicon substrate such as quartz or sapphire. In this case, the semiconductor layer would simply comprise the entire substrate and would preferably comprise monocrystalline silicon.

The semiconductor layer contains an emitter region (n+) 212, a barrier region (p) 216, a collector region (p+) 220, and a drift region ($\iota$ or $v$) 224. The particular scheme of the embodiment device is n+/p/$\iota$ or $v$/p+. A second scheme will be presented in FIG. 10. Returning to FIG. 5, the barrier region (p) 216 is in contact with, and is laterally adjacent to, the emitter region 212 (n+). The drift region ($\iota$ or $v$) 224 comprises the area of the semiconductor layer between the barrier region (p) 216 and the collector region (p+) 220.

A most important feature of the BBT diode is the presence of the gate 232 and 228. The gate 232 and 228 comprises a conductor layer 232 overlying the drift region ($\iota$ or $v$) 224, the barrier region 216, and at least a part of the emitter region (n+) 212, with an insulator layer 228 therebetween. An overlap of the gate 232 and 228 and the emitter region 212 is shown to emphasis the important feature that the gate overlie at least a part of the emitter. This feature impacts the ability to induce band-to-band carrier tunneling as will be discussed below.

More specifically, the emitter region (n+) 212 preferably comprises a heavily doped n-type region in the semiconductor layer 224. Preferably, the emitter region (n+) 212 comprises a doping concentration of greater than about $1 \times 10^{19}$ atoms/cm$^3$ of dopant comprising either As, P, or both. The barrier region (p) preferably comprises a doping concentration of about $1 \times 10^{18}$ atoms/cm$^3$ of dopant comprising B. The barrier region 216 preferably has a dopant concentration of about one order of magnitude less than that of the emitter region 212.

The semiconductor layer 224, particularly as regards the drift region 224, preferably comprises a very lightly doped region that may be nearly intrinsic. The drift region 224 may comprise either an n-type ($\iota$) or a p-type ($v$) impurity. Preferably, the semiconductor layer 224 comprises a doping concentration of less than about $1 \times 10^{15}$ atoms/cm$^3$ with a dopant comprising phosphorous for an n-type ($\iota$) as in FIG. 6 for simplicity. The collector region (p+) 220 preferably comprises a heavily doped p-type region. The collector region (p+) 220 is preferably doped by boron to a concentration of larger than about $1 \times 10^{19}$ atoms/cm$^3$.

The insulator layer 228 preferably comprises an oxide, and more preferably, a silicon oxide film. Other gate dielectrics, commonly used in CMOS technology, including, for example, silicon oxynitride, silicon nitride, tantalum oxide ($Ta_2O_5$), and aluminum oxide ($Al_2O_3$), are applicable to this disclosure. The insulator layer can be formed at the same step as the gate oxide of the CMOS on a same wafer. Preferably, the insulator layer 228 is between about 10 Angstroms and 100 Angstroms thick, corresponding to the gate oxide thickness for CMOS technology generations ranging from 0.07 micron to 0.5 micron.

The conductor layer 232 preferably comprises a polysilicon layer, and more preferably, comprises a doped polysilicon layer. In addition, the conductor layer 232 may comprise other applicable gate materials including metals, such as Al and MO, metal silicides, such as TiSi and CoSi, and metal nitrides, such as TiN and WN, may also be used. Finally, combination stacks of any of these may be used. The conductor layer 232 is preferably between about 1000 Angstroms and 5000 Angstroms thick. The preferred embodiment uses shallow trench isolation (STI) 208 to define and isolate the device. Any isolation scheme, such as LOCOS, could be used.

Figure 6:
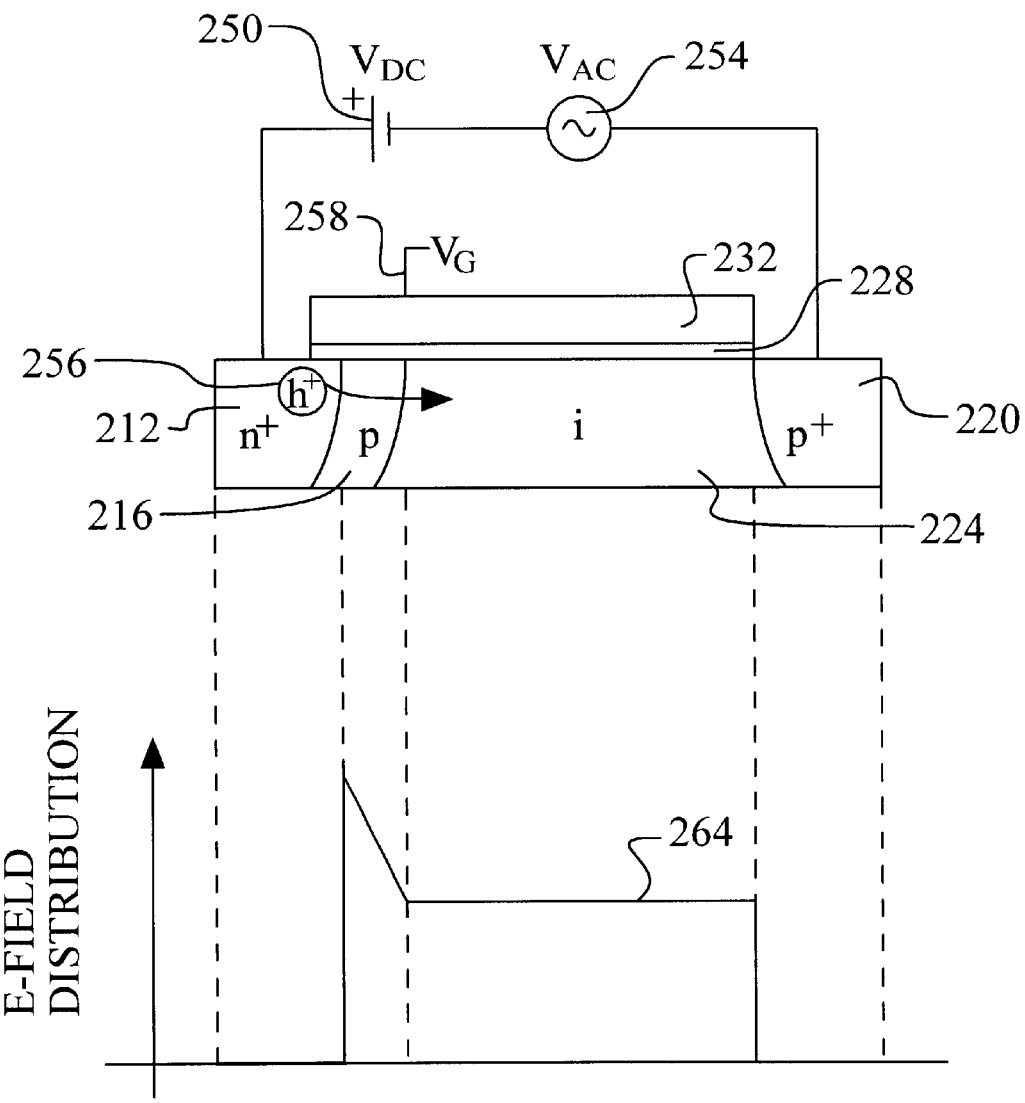
FIG. 6 illustrates a simplified diagram of the preferred embodiment BBT diode device and a graph of the electric field distribution across this BBT device during normal operation.

Referring now to FIG. 6, the operating principles of the BBT transit time diode device are illustrated. A simplified diagram of the BBT device and voltage biasing is shown. The electric field distribution in the device is plotted as in the example cases.

The gate bias voltage $V_G$ 258 plays a novel and distinctive role in the operation of the device. First, the gate bias voltage $V_G$ 258 controls whether the drift region 224 is in depletion, for normal operation, or in accumulation, for turn-off negative resistance effect. Preferably, a gate bias voltage $V_G$ 258 of about 0 Volts, or of between 0 Volts and $-V_{cc}$, is sufficient to fully deplete the drift region 224. Preferably, a gate bias voltage $V_G$ 258 of about $V_{cc}$, where $V_{cc}$ is an externally supplied voltage source of about 2.5 Volts or about 3.3 Volts, is sufficient to cause the drift region 224 to enter the accumulation mode. Preferably, this accumulation voltage level corresponds to the $V_{cc}$ supply for the CMOS integrated circuit device. Note that the surface of the drift region underneath the gate is preferably not in inversion during operations of the BTT transit time device. The surface dopant concentration can be adjusted by a $V_t$ ion implantation to insure this.

A dc bias voltage $V_{DC}$ 250 is needed for the BBT diode device to operate in a small-signal power gain region. Note that the drift region must be fully depleted, by applying an appropriate gate bias $V_G$, for operating in a small-signal power gain region. The dc bias voltage $V_{DC}$ 250 creates a positive voltage potential between the emitter junction (n+) 212 and the gate 232. This voltage difference between the emitter and gate is preferably optimized such that holes (h+) 256 are generated at the surface of the emitter junction (n+) 212 during the positive cycle of the ac voltage signal $V_{AC}$ 254. These holes (h+) 256 are created by band-to-band tunneling caused the high electric field at the surface of the emitter 212 underlying the gate conductor 232. This is why it is important for the gate 232 and 228 to overlie at least a part, for example, about 0.1 microns, of the emitter junction (n+) 212. The dc bias voltage $V_{DC}$ 250 is preferably about $+V_{CC}$ and corresponds to the typical $V_{CC}$ supply for the IC device.

Holes (h+) 256 that are generated by this gate-induced, band-to-band tunneling mechanism are transported across the drift region 224 as GIDL current flowing to the collector junction 220. The electric field distribution plot 264 illustrates how the field is maximized at the n+/p interface.

Figure 7:
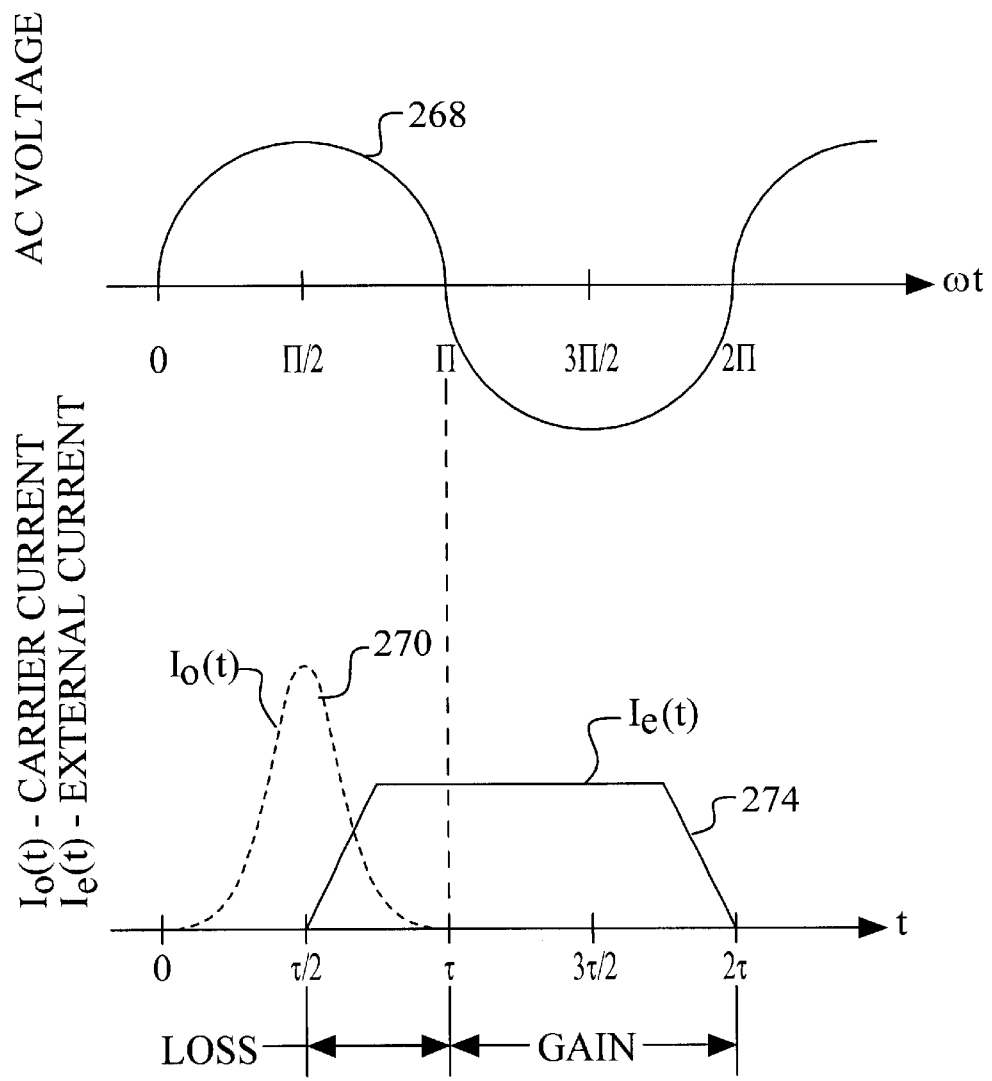
FIG. 7 illustrates the high frequency response of the preferred embodiment BBT diode device of the present invention.

Referring now to FIG. 7, the small signal, ac performance of the BBT transit time device of the preferred embodiment is illustrated. The ac voltage signal $V_{AC}$ 254 is again illustrated as a signal cycling with a positive half-cycle, between frequency-time locations 0 and π, and a negative half-cycle, between π and 2π. The gate-induced, band-to-band tunneling creates significant hole current, $I_o(t)$ 270, during the positive half-cycle. Note that there is no delay in the creation of this current $I_o(t)$ 270 and the maximum $I_o(t)$ 270 value is therefore found at the maximum of the ac voltage $V_{AC}$ positive cycle occurring at π/2.

The hole current $I_o(t)$ 270 immediately begins flowing into the drift region. At this point, the state of the gate voltage, $V_G$ 258, is critical. If the gate electrode 232 is at the depletion voltage, the drift region will transport the carriers at the saturation velocity ($v_s$). In this case, the output current $I_e(t)$ 274 will begin to flow to the collector junction 220. If, however, the gate electrode 232 is at the accumulation voltage, the drift region will not transport the holes and the BBT diode device will be OFF.

Note that in the ON-state, shown in the FIG. 7, the drift region is optimized to create a delay of 3π/2, wherein π=ωL/$v_s$. This transmit time delay causes a negative resistance response by the BBT diode device during the negative half-cycle of between π and 2π. However, as in the BARITT case, the BBT device exhibits some power loss during the second half of the positive half-cycle of between π/2 and π.

Figure 8:
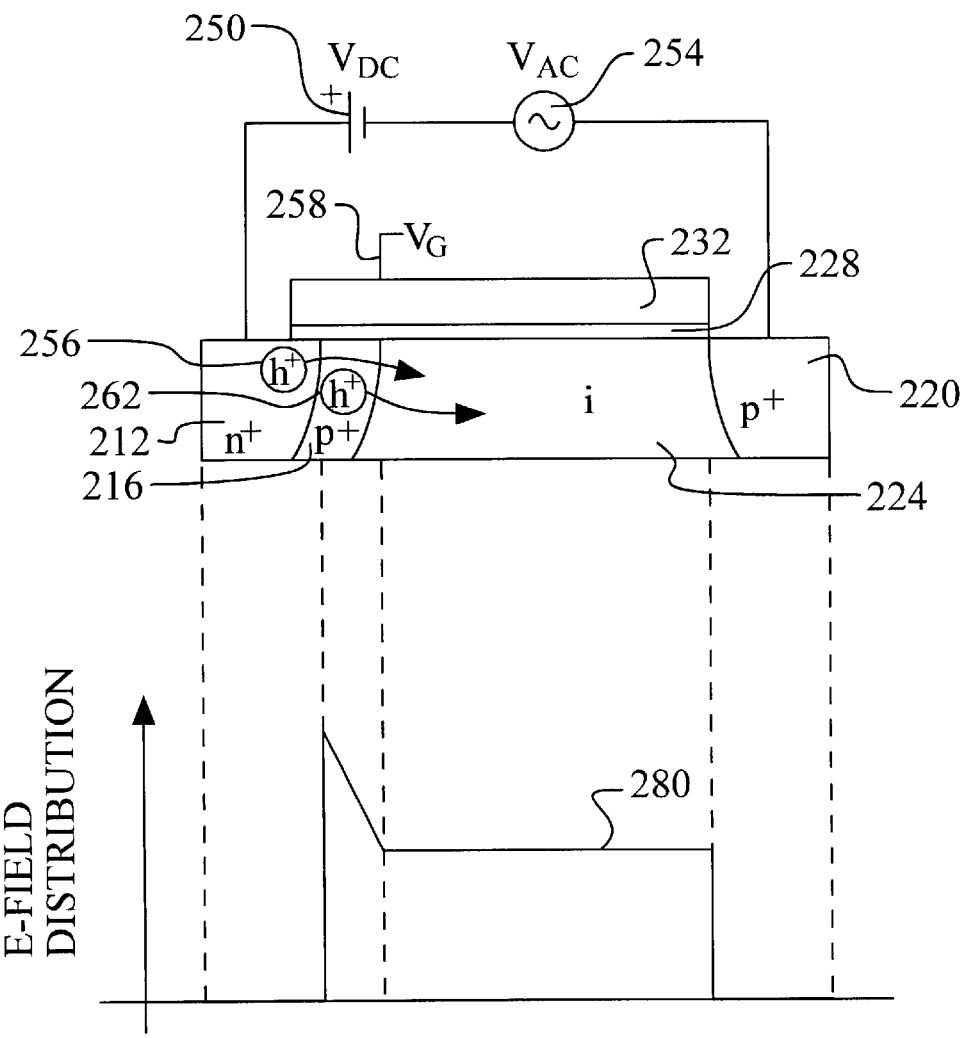
FIG. 8 illustrates a simplified diagram of the preferred embodiment BBT diode device where the barrier junction concentration is increased such that the device works in an avalanche-enhanced mode. A graph of the electric field distribution across this avalanche-enhanced BBT diode device during normal operation is also shown.

The BBT device may be improved by adding avalanche enhancement. Referring particularly now to FIG. 8, the barrier region 216 may be altered to increase the doping concentration to a heavily doped p+ level. Preferably, the barrier region (p+) 216 for the avalanche-enhanced version would comprise a doping concentration of greater than about $1 \times 10^{19}$ atoms/cm$^3$.

By increasing the doping concentration of the barrier region 216 to a p+ level, the resulting emitter-barrier junction is n+/p+ 212 and 216. This sharply profiled junction results in a much lower trigger voltage for impact ionization under reverse bias. Therefore, while a reverse bias of about the $V_{CC}$ level only presented a mild-reverse bias for the n+/p junction, the same bias is near the avalanche voltage for the n+/p+ junction. Furthermore, the presence of the gate voltage of between about 0 Volts and $-V_{CC}$ causes the electric field potential to be highest at the n+/p+ interface as shown in 280.

The result of the impact ionization effect is that the avalanche enhanced BBT now exhibits both band-to-band tunneling and avalanche injection. The band-to-band tunneling creates holes (h+) 256 as in the previous example. The avalanche mechanism also creates holes (h+) 262 in much the same way as the IMPATT diode example. As will be seen, the avalanche mechanism offers a performance advantage to the BBT in the area of small-signal power gain. Finally, note that an alternative means of enhancing the BBT injection mechanism via avalanche would be to raise the dc bias voltage $V_{DC}$ 350 to, for example, $2V_{CC}$, that may be generated on chip by a conventional charge pump circuit.

Figure 9:
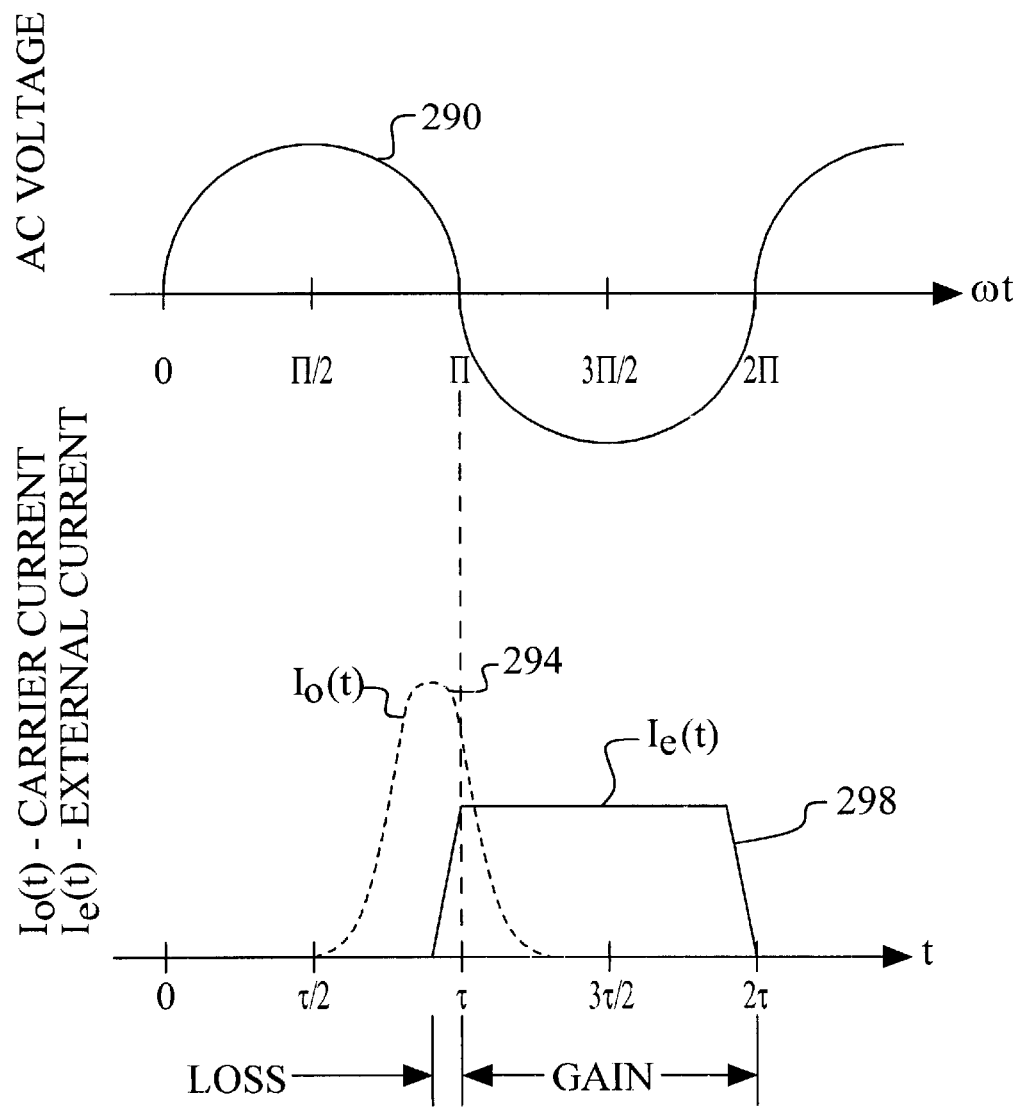
FIG. 9 illustrates the high frequency response of the preferred embodiment BBT diode device of the present invention in avalanche-enhanced operation.

Referring now to FIG. 9, the performance of the avalanche-enhanced BBT diode device is shown. The ac small signal voltage $V_{AC}$ 254 is plotted as 290. Notice the effect that the avalanche mechanism has on the hole current $I_o(t)$ 294. As discussed in the IMPATT example, the avalanche multiplication will continuously build-up, so that, the maximum hole current $I_o(t)$ 294 occurs at the maximum positive cycle voltage at π/2. The hole current $I_o(t)$ 294 is shifted by nearly 90 degrees with respect to the ac voltage. The subsequent external current $I_e(t)$ 298 is then generated mostly during the negative input cycle. Therefore, the avalanche-enhanced BBT device reduces the small-signal power loss when compared to the non-enhanced BBT device. Of course, some increase in avalanche-multiplication noise may be experienced as well.

Note that the BBT and the avalanche-enhanced BBT diode devices exhibit excellent small-signal power gain without requiring large voltage biases. The presence of the novel gate improves the performance of the device by facilitating the band-to-band tunneling at low reverse bias voltages.

Figure 10:
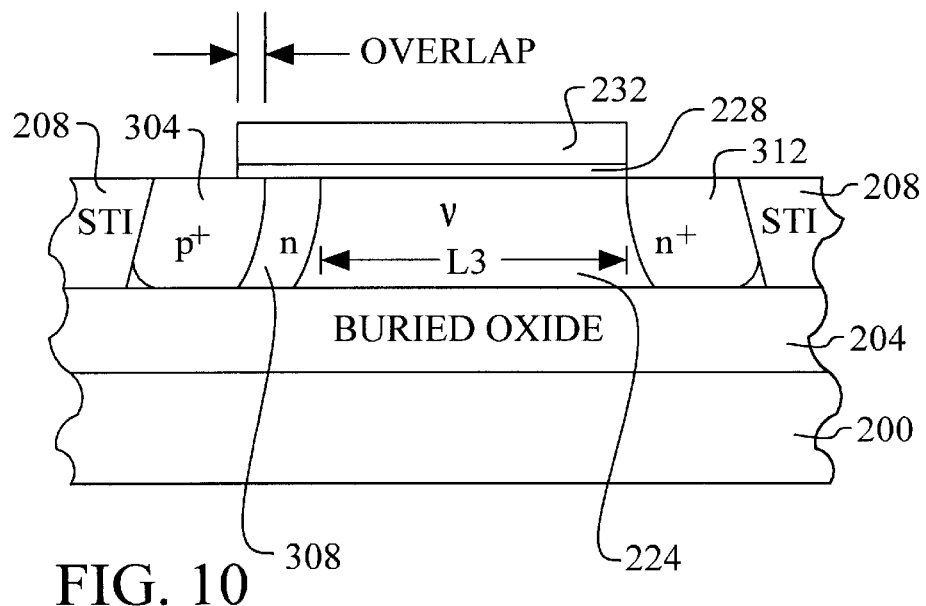
FIG. 10 illustrates a cross section of the preferred embodiment for the reversed doping case (p+/n/i/n+) of the band-to-band tunneling transit time (BBT) diode device of the present invention.

Referring now to FIG. 10, the preferred embodiment of the BBT diode device of the present invention is illustrated for the reversed doping case. In this case, the emitter region 304 is heavily doped p-type (p+), the barrier region 308 is doped n-type (n), and the collector region 312 is heavily doped n-type (n+). Preferably, the emitter region (p+) 304 comprises a doping concentration of greater than about $1 \times 10^{19}$ atoms/cm$^3$ and comprising boron. The barrier region (n) 308 preferably comprises a dopant of As or P at a doping concentration of about $1 \times 10^{18}$ atoms/cm$^3$. The semiconductor layer 224 once again comprises a nearly intrinsic layer that may be either an n-type (ι) or a p-type (ν) impurity. Preferably, the semiconductor layer 224 comprises a doping concentration of less than about $1 \times 10^{15}$ atoms/cm$^3$. The semiconductor layer 224 is doped with p-type (boron) in FIG. 10 for simplicity. The surface of the nearly intrinsic p-type (ν) is also $V_T$ implanted, so that there is no inversion during operation. The collector region (n+) 312 preferably comprises a heavily doped p-type region. The collector region (n+) 312 is preferably doped with As or P to a concentration of greater than about $1 \times 10^{19}$ atoms/cm$^3$. The remaining features of the reversed doping scheme BBT are the same as those described in FIG. 5 above.

The operating principles for the reversed doping BBT diode are essentially the same with a few changes. First, the current carriers generated by the BBT mechanism are electrons rather than holes. Second, the gate voltage for accumulating the drift region 224 and turning the diode OFF is negative while the depletion, or turn ON, voltage remains at about 0 Volts. Finally, the dc bias voltage on the emitter region 304 is negative.

The reversed doping scheme BBT can be avalanche-enhanced either by increasing the doping of the barrier junction to create an n+ junction or by increasing the negative voltage bias on the emitter junction 304. Preferably, the n+ barrier region 308 for the avalanche-enhanced version comprises As or P with a doping concentration of larger than about $1 \times 10^{19}$ atoms/cm$^3$.

Figure 11:
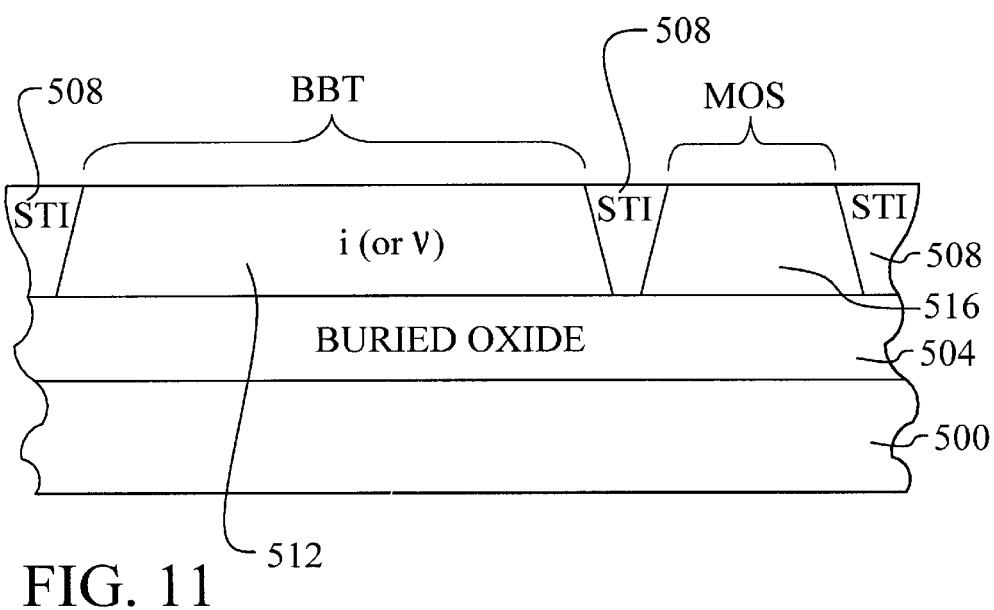
FIGS. 11 through 16 illustrate the preferred embodiment of the method of manufacturing the BBT diode device of the present invention.

Referring now to FIG. 11, a method to fabricate the present invention is illustrated. This method is particularly suited for integration of the BBT transit time diode device into a CMOS process. A silicon-on-insulator process is again illustrated.

A substrate 500 is provided. A buried insulator layer 504 is formed overlying the substrate as conventional in the art. A semiconductor layer 512 and 516 is formed overlying the buried insulator layer. Such a silicon-on-insulator (SOI) wafer is commercially available. Bulk silicon wafers, however, cannot be used in this invention due to the requirement of a bottom-side isolation. The semiconductor layer 512 and 516 is formed as isolated sections comprising the BBT section and the MOS section using shallow trench isolation (STI) as well known in the art. As noted above, the semiconductor layer 512 for the BBT devices preferably comprises a very lightly doped, even intrinsic layer. Depending on the MOS process, this semiconductor layer 512 may not be suitable for the MOS devices. Therefore, a part of the semiconductor layer 516, wherein the MOS devices will be formed, may be doped differently using an ion implantion. Shallow trench isolations (STI) 508 are formed in the semiconductor layer 512 and 516 as conventional in the art to define active regions.

The semiconductor layer 512 and 516 preferably comprises silicon, and more preferably, epitaxially-grown silicon. The BBT semiconductor layer 512 preferably comprises a nearly intrinsic impurity doping concentration of less than about $1 \times 10^{15}$ atoms/cm$^3$. In the case of an epitaxially-grown layer 512, this impurity doping concentration could be achieved typically in process.

Figure 12:
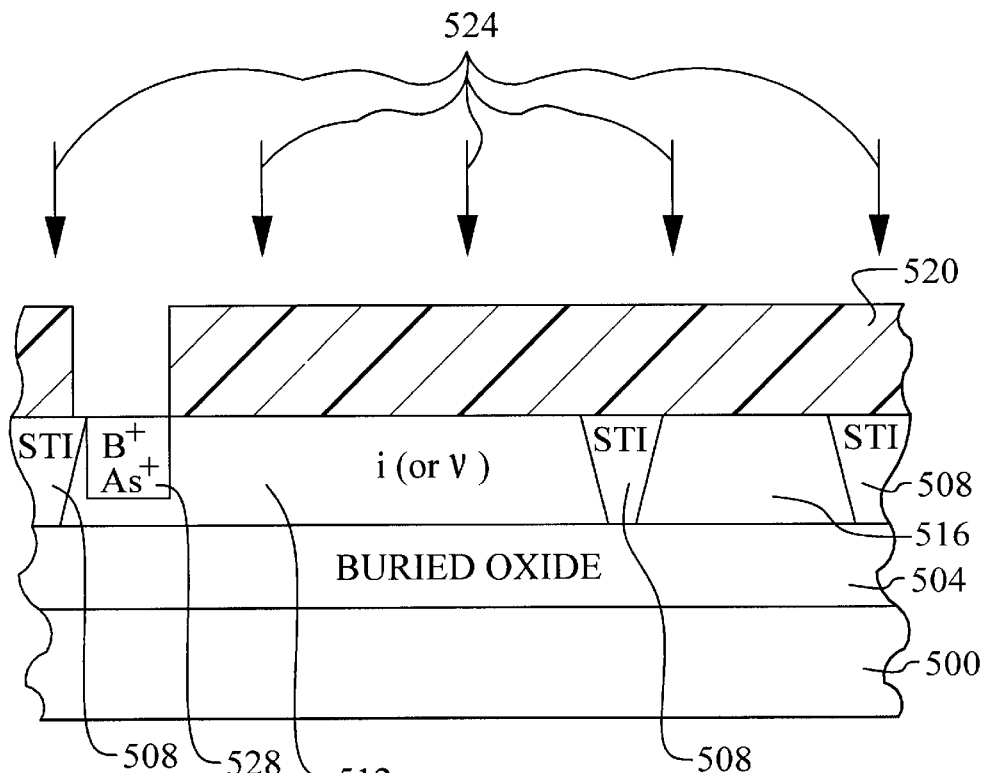

Referring now to FIG. 12, an important feature of the method is illustrated. Ions are implanted 524 into the BBT semiconductor layer 512 to form a non-diffused, common emitter and barrier region 528. An ion implantation mask 520 preferably comprises a single masking layer 520 that has been patterned to expose the semiconductor layer 512 where the emitter and barrier regions are planned. This single masking layer 520 may comprise, for example, a photoresist layer that has been coated, exposed to UV light through a reticle, and then developed and baked. The ion implantation operation 524 preferably comprises a two-step process wherein boron ions (B+) and arsenic ions (As+) are implanted sequentially into the exposed semiconductor layer 512. A common, non-diffused junction 528 is thereby formed. The boron ion (B+) implantation preferably comprises a dose of between about $1 \times 10^{14}$ atoms/cm$^2$ and $5 \times 10^{14}$ atoms/cm$^2$ and an energy of between about 30 KeV and 80 KeV. The arsenic ion (As+) implantation preferably comprises a dose of between about $1 \times 10^{14}$ atoms/cm$^2$ and $5 \times 10^{14}$ atoms/cm$^2$ and an energy of between about 50 KeV and 120 KeV.

Figure 13:
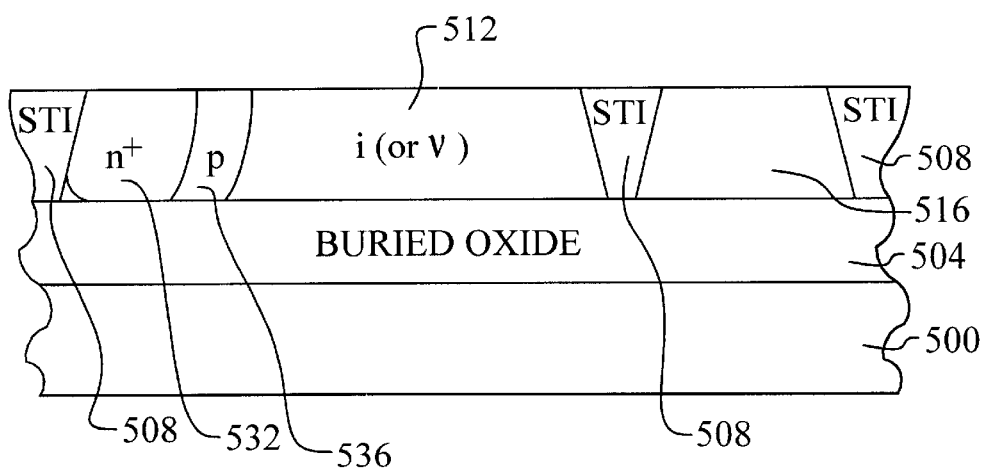

Referring now to FIG. 13, a rapid thermal anneal (RTA) is performed to drive-in and activate the implanted ions. Most importantly, note that the boron ions (B+) have a higher diffusion rate than the arsenic ions (As). This difference causes the boron (p-type) barrier junction 536 to out-diffuse farther than the arsenic (n-type) emitter junction 532. In this way, both junctions 532 and 536 are formed using a single masking step and RTA. Alternatively, two, independent masking, ion implantation, and RTA steps could be used to form the regions 532 and 536.

Figure 14:
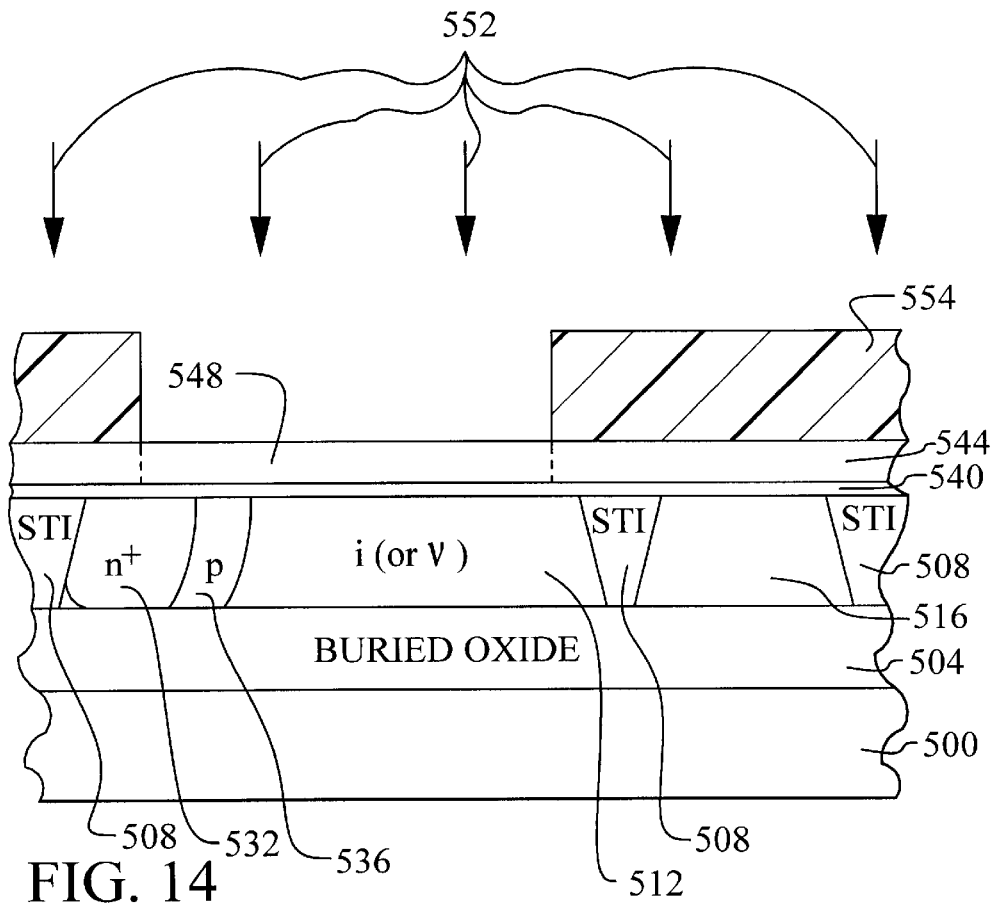

Referring now to FIG. 14, an insulator layer 540 is formed overlying the semiconductor layer 512. More specifically, the insulator layer 540 preferably comprises an oxide layer, and more specifically, a silicon oxide film. Other gate dielectrics, commonly used in CMOS technology, include silicon oxynitride, silicon nitride, tantalum oxide (Ta$_2$O$_5$), and aluminum oxide (Al$_2$O$_3$), and are applicable to this disclosure. The insulator layer 540 is preferably formed to between about 10 Angstroms and 100 Angstroms thick or an equivalent oxide thickness to the used in the CMOS technology for the 0.1 micron to 0.5 micron generations. The insulator layer 540 may be formed by thermal oxidation or by a deposition process such as CVD.

A conductor layer 544, preferably comprising undoped polysilicon, is deposited overlying the insulator layer. If undoped polysilicon is used, then ions are then implanted into the conductor layer 544 to alter the doping type of the BBT portion of the conductor layer 548. This particular doping type of polysilicon gate can enhance the BBT generation by utilizing the built-in field increase from work function difference. The conductor layer 544 preferably comprises a polysilicon layer. In addition, the conductor layer 544 may comprise other applicable gate materials include metals, such as Al and MO, metal silicides, such as TiSi and CoSi, and metal nitrides, such as TiN and WN, may also be used. Finally, combination stacks of any of these may be used. The conductor layer 544 is preferably between about 1000 Angstroms and 5000 Angstroms thick.

The ion implantation 552 of the conductor layer 544 in the BBT area 548 is necessary to insure that the depletion and accumulation voltage for the BBT diodes is optimized. Preferably, the polysilicon gate conductor layer 544 doping type will be n-type for p+ emitter and will be p-type for n+ emitter. This arrangement is reverse that used for the MOS devices where the n-type polysilicon is used for the n-channel devices and the p-type polysilicon is used for the p-channel devices. Using a polysilicon doping of "reverse" type can enhance the generation of BBT as by causing a one band-gap change in the voltage across the insulator as described in Lindert et al, above. A masking layer 554 is used to block the implantation 552 from the non-BBT areas. The masking layer 554 may comprise, for example, a photoresist layer that is deposited, exposed to UV light through a reticle, and then developed and baked. If the gate conductor layer is metal or silicide, then there is no need for a gate doping process.

Figure 15:
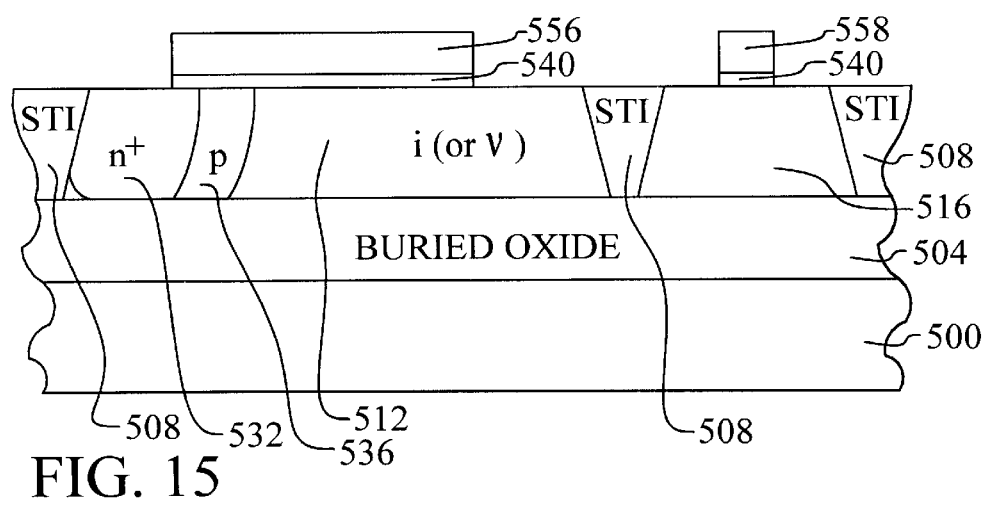

Referring now to FIG. 15, the gate conductor layer 544 is patterned to form the gates 556 for the BBT diode devices and the gates 558 for the MOS devices. This patterning step uses, for example, a masking layer, not shown, to control an anisotropic etching process. Note that the gates 556 for the BBT diode devices are patterned such that they overlie the barrier junction 536 and at least a part of the emitter region 532.

Figure 16:
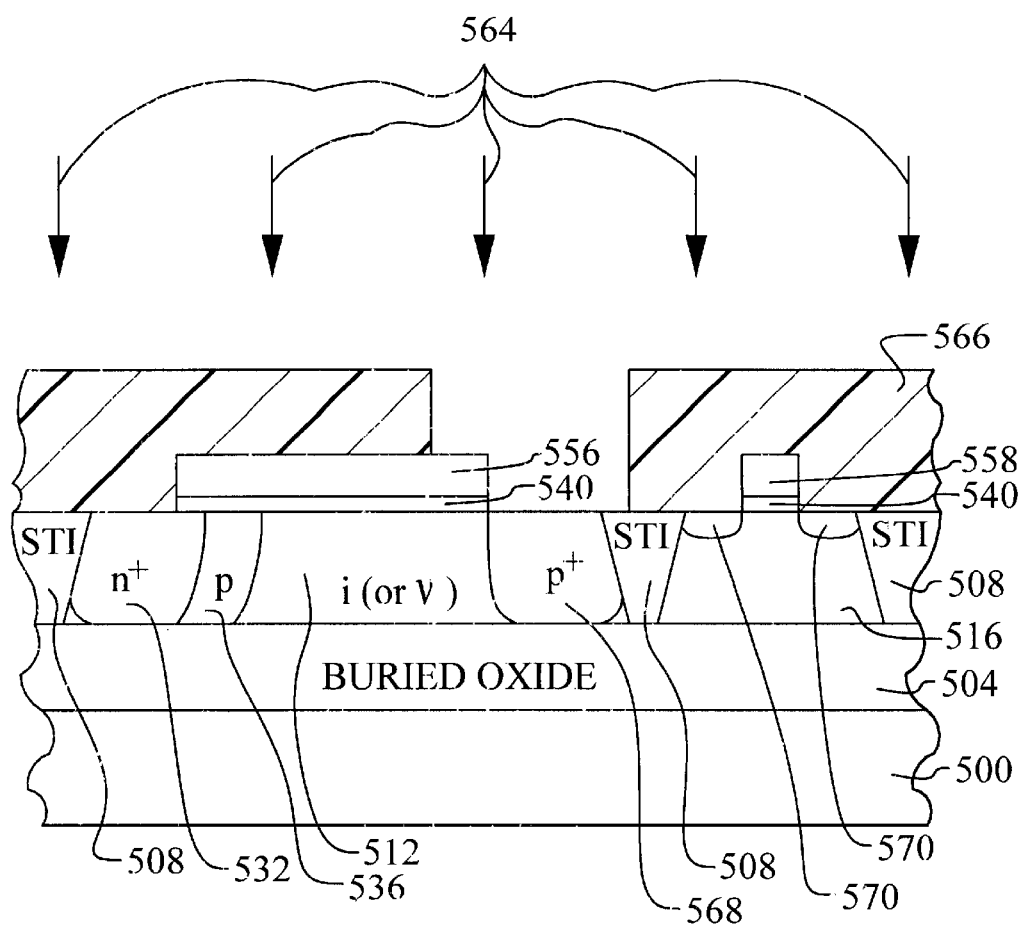

Referring now to FIG. 16, ions are implanted 564 into the semiconductor layer 512 to form the collector regions 568 for the BBT diode devices and to complete the BBT diode devices in the manufacture of the integrated circuit device. The ion implantation 564 preferably comprises a dose of between about $1 \times 10^{15}$ atoms/cm$^2$ and $5 \times 10^{15}$ atoms/cm$^2$ and an energy of between about 30 KeV and 80 KeV. Note that the drift region 512 is bounded by the barrier region 536 and the collector region 568. The ion implantation 564 preferably uses a masking layer 566 comprising, for example, a photoresist layer patterned as described above. Note that the source and drain junctions 570 for the PMOS devices may be formed in the same operation. The process for BBT transit time diode is therefore compatible with typical CMOS technology.

The advantages of the present invention may now be summarized. A negative resistance diode device is achieved. A novel gate controls the diode small-signal power gain. The gate-controlled, negative resistance diode device is integrated into an MOS process. The gate-controlled, negative resistance diode device exhibits excelled negative resistance (gain) and low loss at high signal frequencies.

As shown in the preferred embodiments, a novel gate-controlled, negative resistance diode device and method of manufacture thereof are achieved.

While the invention has been particularly shown and described with reference to the preferred embodiments thereof, it will be understood by those skilled in the art that various changes in form and details may be made without departing from the spirit and scope of the invention.

What is claimed is:

1. A gate-controlled, BBT transit time diode device comprising:
    a substrate;
    a buried insulator layer overlying said substrate;
    a semiconductor layer overlying said buried insulator layer;
    an emitter region in said semiconductor layer wherein said emitter region extends down to said buried insulator layer;
    a barrier region in said semiconductor layer wherein said barrier region is in contact with said emitter region and is laterally adjacent to said emitter region and wherein said barrier region extends down to said buried insulator layer;
    a collector region in said semiconductor layer wherein said collector region extends down to said buried insulator layer;
    a drift region comprising said semiconductor layer between said barrier region and said collector region; and
    a gate comprising a conductor layer overlying said drift region, said barrier region, and at least a part of said emitter region with an insulator layer therebetween.

2. The device according to claim 1 wherein said semiconductor layer comprises one of the group of: n-type doped and p-type doped.

3. The device according to claim 1 wherein said semiconductor layer comprises silicon.

4. The device according to claim 1 wherein said semiconductor layer comprises a dopant concentration of less than about $1 \times 10^{15}$ atoms/cm$^3$.

5. The device according to claim 1 further comprising a buried insulator layer underlying said semiconductor layer.

6. The device according to claim 1 wherein said conductor layer consists of one of the group of: polysilicon, metals, metal silicide, metal nitrides, and combinations thereof.

7. The device according to claim 1 wherein said insulator layer consists of one of the group of: oxide, silicon oxide, silicon oxynitride, silicon nitride, tantalum oxide, and aluminum oxide.

8. The device according to claim 1 wherein said emitter region is n-type, said barrier region is p-type, and said collector region is p-type.

9. The device according to claim 8 wherein said emitter region comprises a dopant concentration of greater than about $1 \times 10^{19}$ atoms/cm$^3$.

10. The device according to claim 8 wherein said barrier region comprises a dopant concentration of about $1 \times 10^{18}$ atoms/cm$^3$.

11. The device according to claim 1 wherein said emitter region is p-type, said barrier region is n-type, and said collector region is n-type.

12. The device according to claim 11 wherein said emitter region comprises a dopant concentration of greater than about $1 \times 10^{19}$ atoms/cm$^3$.

13. The device according to claim 11 wherein said barrier region comprises a dopant concentration of about $1 \times 10^{18}$ atoms/cm$^3$.

14. A gate-controlled, BBT transit time diode device comprising:
    a substrate;
    a buried insulator layer overlying said substrate;
    a semiconductor layer overlying said buried insulator layer;
    an emitter region in said semiconductor layer wherein said emitter region extends down to said buried insulator layer;
    a barrier region in said semiconductor layer wherein said barrier region is in contact with said emitter region and is laterally adjacent to said emitter region and wherein said barrier region extends down to said buried insulator layer;
    a collector region in said semiconductor layer wherein said collector region extends down to said buried insulator layer;
    a drift region comprising said semiconductor layer between said barrier region and said collector region; and
    a gate comprising a polysilicon layer overlying said drift region, said barrier region, and at least a part of said emitter region with an oxide layer therebetween.

15. The device according to claim 14 wherein said semiconductor layer comprises one of the group of: n-type doped and p-type doped.

16. The device according to claim 14 wherein said semiconductor layer comprises silicon.

17. The device according to claim 14 wherein said semiconductor layer comprises a dopant concentration of less than about $1 \times 10^{15}$ atoms/cm$^3$.

18. The device according to claim 14 wherein said emitter region is n-type, said barrier region is p-type, and said collector region is p-type.

19. The device according to claim 18 wherein said emitter region comprises a dopant concentration of greater than about $1 \times 10^{19}$ atoms/cm$^3$.

20. The device according to claim 18 wherein said barrier region comprises a dopant concentration of about $1 \times 10^{18}$ atoms/cm$^3$.

21. The device according to claim 14 wherein said emitter region is p-type, said barrier region is n-type, and said collector region is n-type.

22. The device according to claim 21 wherein said emitter region comprises a dopant concentration of greater than about $1 \times 10^{19}$ atoms/cm$^3$.

23. The device according to claim 21 wherein said barrier region comprises a dopant concentration of about $1 \times 10^{18}$ atoms/cm$^3$.

* * * * *

UNITED STATES PATENT AND TRADEMARK OFFICE
CERTIFICATE OF CORRECTION

PATENT NO. : 6,657,240 B1
DATED : December 2, 2003
INVENTOR(S) : Min-Hwa Chi

It is certified that error appears in the above-identified patent and that said Letters Patent is hereby corrected as shown below:

Title page,
Item [73], delete "Taiwan Semiconductoring Manufacturing Company, Hsin-Chu (TW)", and replace with -- Taiwan Semiconductor Manufacturing Company, Hsin-Chu (TW) --.

Signed and Sealed this

First Day of June, 2004

JON W. DUDAS
*Acting Director of the United States Patent and Trademark Office*